United States Patent [19]
Lee et al.

[11] Patent Number: 5,500,389
[45] Date of Patent: Mar. 19, 1996

[54] PROCESS FOR FORMATION FOR HETERO JUNCTION STRUCTURED FILM UTILIZING V GROOVES

[75] Inventors: Seung-Chang Lee; Sun-Jin Yun; Bo-Woo Kim; Sang-Won Kang, all of Daejeon, Rep. of Korea

[73] Assignee: Electronics & Telecommunications Research Institute, Daejeon, Rep. of Korea

[21] Appl. No.: 342,031

[22] Filed: Nov. 17, 1994

[30] Foreign Application Priority Data

Dec. 3, 1993 [KR] Rep. of Korea .................. 93-26318

[51] Int. Cl.⁶ .................................................. H01L 21/20
[52] U.S. Cl. .......................... 437/90; 437/84; 437/89; 437/106; 437/107; 437/126; 437/131; 437/132; 437/133; 117/101
[58] Field of Search ........................ 437/68, 84, 89, 437/90, 106, 107, 126, 131–133; 117/101

[56] References Cited

U.S. PATENT DOCUMENTS

| | | | |
|---|---|---|---|
| 4,517,047 | 5/1985 | Change et al. | 427/87 |
| 4,717,681 | 1/1988 | Curran | 437/68 |
| 4,771,013 | 9/1988 | Curran | 437/131 |
| 5,256,550 | 10/1993 | Laderman et al. | 437/131 |
| 5,272,105 | 12/1993 | Yacobi et al. | 437/133 |
| 5,273,616 | 12/1993 | Bozler et al. | 117/95 |

FOREIGN PATENT DOCUMENTS

| | | | |
|---|---|---|---|
| 1312821 | 12/1989 | Japan | 437/132 |

*Primary Examiner*—R. Bruce Breneman
*Assistant Examiner*—Ramamohan Rao
*Attorney, Agent, or Firm*—Antonelli, Terry, Stout & Kraus

[57] ABSTRACT

A process for formation of a hetero junction structured film utilizing V grooves is disclosed. A monocrystalline film 1 is etched into V grooves, and thereupon, a hetero film 2 having misfits is grown, so that dislocations would be intensively distributed within the V grooves. Then, an oxide layer 3 is formed thereupon, and then, the portions of the oxide layer 3 and the hereto film 2 corresponding to the V grooves are removed by carrying out an etching. Then, the residue oxide layer is removed, thereby forming a non-stress non-dislocation hetero junction structure. Further, the following steps can be added. That is, on the above structure, a thin oxide layer 3 is deposited by carrying out a thermal oxidation or a chemical deposition, and then, a polycrystalline silicon film 4 is deposited. Then the surface irregularities are smoothened by carrying out a selective grinding. Or the following steps may be added. That is, the V groove portions of the hetero film 2 and the monocrystalline film 1 are filled with a monocrystalline film, and the residue oxide layer 3 is removed. Thus a hetero junction film can be grown in which the stress effect is minimized, and the dislocation concentration is made to be extremely low.

12 Claims, 5 Drawing Sheets

5,500,389

PROCESS FOR FORMATION FOR HETERO JUNCTION STRUCTURED FILM UTILIZING V GROOVES

FIELD OF THE INVENTION

The present invention relates to a process for formation of a misfit hereto junction structured film, and particularly, the present invention relates to a process for formation of a hetero junction structured film utilizing V grooves, in which the distribution of misfit dislocations is made to be concentrated around V grooves so as to remove them, thereby minimizing the stress effect, and making it possible to form a hereto junction structured film having an extremely low dislocation density.

BACKGROUND OF THE INVENTION

Generally, when a hetero junction structure is grown by utilizing monocrystalline films having misfits, the thickness of the non-dislocation film which can be grown based on a stress effect caused by the misfits is limited to a certain critical thickness.

Therefore, there has been a large amount of difficulties in applying the electrical properties and optical and quantum effects of the hereto junction structure to the formation of devices.

Further, there exist limiting factors due to the stress effect, and therefore, conventionally when the thin film is grown, efforts have been concentrated on growing the non-dislocation film within the critical thickness.

When the stress effect is not removed, it results in a thermal instability.

Therefore, during the continuous slackening of the stress, the structural and electrical characteristics are aggravated due to the misfit dislocations which are grown near the boundary of the hetero junction structure.

Particularly, such an aggravation of the characteristics of the film shortens the life expectancy of the device, and therefore, it is recognized that the aggravation is very undesirable from the view point of the device application.

In an attempt to overcome the above described disadvantages, there have been proposed to remove the stress effect, or to artificially adjust the distribution of the misfit dislocations. Such proposals are disclosed in the following patents.

That is, several Japanese patents (J03034326, EP-420663 and J62095814) and U.S. Pat. No. 4,517,047 describe methods for removing or artificially adjusting the distribution of the misfit dislocations which are generated in the process of slackening the stress effect which is caused during the growing of the misfit hetero junction structure.

However, such methods are effective in inhibiting the formation of the misfit dislocations by adjusting the stress distribution by utilizing the superlattice, but the stress effect cannot be completely eliminated.

British Patent 2215514 describes a method for completely removing the stress effect.

In this patent, a trench process which has been used for electrically isolating the unit elements is utilized for isolating the whole surface of the substrate into a plurality of small areas so as to eliminate the stress effect. Further, an area in which the dislocation density is extremely low regionally is formed to use it as the device.

However, in this method, while it has the advantage of eliminating the stress effect, it is almost impossible to refill in a monocrystalline form the removed portion which is formed by the trench process. Therefore, there remains the problem that the whole face of the substrate cannot be utilized.

SUMMARY OF THE INVENTION

The present invention is intended to overcome the above described disadvantages of the conventional techniques.

Therefore it is an object of the present invention to provide a process for formation of a hereto junction structured film utilizing V grooves, in which the distributions of the misfit dislocations are made to be concentrated around the V grooves so as to remove the dislocation concentrated areas, thereby making it possible to manufacture a non-stress non-dislocation hetero junction film.

It is another object of the present invention to provide a process for formation of .a hetero junction structured film utilizing V grooves, in which the stress effect is removed by utilizing the V grooves, and the removed dislocation concentrated portions are filled with a monocrystalline film to expand the critical thickness, so that the thickness of the film may be arbitrarily adjusted, and the whole area of the substrate can be utilized.

It is still another object of the present invention to provide a process for formation of a hetero junction structured film utilizing V grooves, in which the structural and electrical characteristics are improved, so that the formation and application of the device may be easy, as well as extending the life expectancy of the device.

BRIEF DESCRIPTION OF THE DRAWINGS

The above object and other advantages of the present invention will become more apparent by describing in detail the preferred embodiment of the present invention with reference to the attached drawings in which.

DESCRIPTION OF THE PREFERRED EMBODIMENT

The present invention will be described in detail referring to FIGS. 1 to 4.

In the present invention, artificial irregularities such as V grooves are formed on the surface of a misfit hetero junction structure on which a stress effect exists. When the structure is heat-treated, the stress slackens, and the misfit dislocations which are formed near the boundary of the structures are concentrated near the V grooves. This physical phenomenon is adversely utilized by the present invention.

Further, there is used a method of growing non-dislocation hetero junction structure in which the stress effect is completely removed or minimized, so that the film thickness may be arbitrarily adjusted regardless of the critical thickness.

FIG. 1 is a sectional view showing a first embodiment of the process for formation of the hetero junction structured film utilizing V grooves according to the present invention.

Figure 1A:
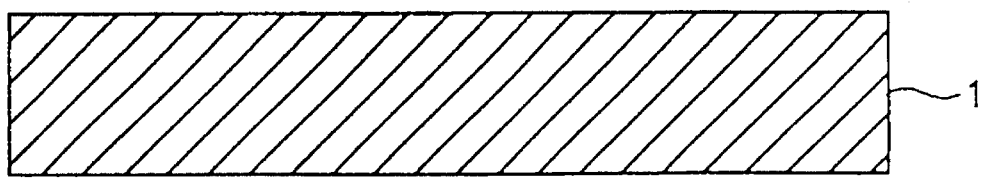
FIGS. 1a to 1g are sectional views showing a first embodiment of the process for formation of the hetero junction film utilizing V grooves according to the present invention.
Figure 1B:
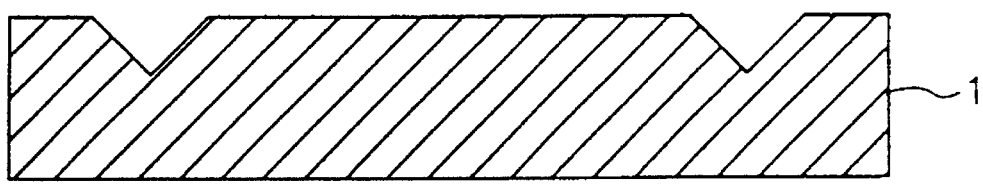

Upon a monocrystalline film 1 which serves as a substrate as shown in FIG. 1a, there is formed a line pattern or a mesh pattern in which V grooves are formed cyclically with certain intervals, and an etching is carried out (refer to FIG. 1b).

By taking into account the misfit degree between the film 1 and another film which is deposited upon the film 1, the above mentioned pattern is provided with V grooves with intervals of several μm to several hundred μm in the longitudinal or lateral direction on the whole area or a part of the area of the film.

Upon the monocrystalline film 1 thus etched, there is grown a V-groove shaped hetero epitaxial film 2 which is misfited with the film 1. (refer to FIG. 1c).

In the case where the thickness of the hetero film 2 is smaller than the critical thickness, misfit dislocations are not formed until the growth is completed, and therefore, the stress effect is removed through a heat treatment, thereby forming misfit dislocations.

On the other hand, if the thickness of the hetero film 2 is larger than the critical thickness, the stress effect is naturally slackened during the growth, thereby forming misfit dislocations.

Figure 1C:
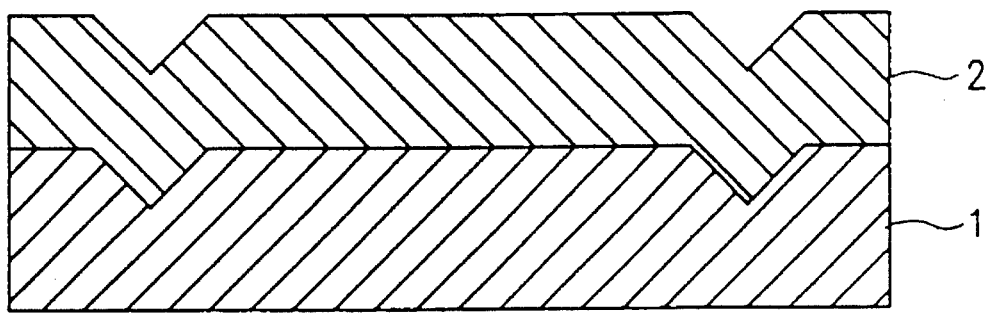
Figure 1D:
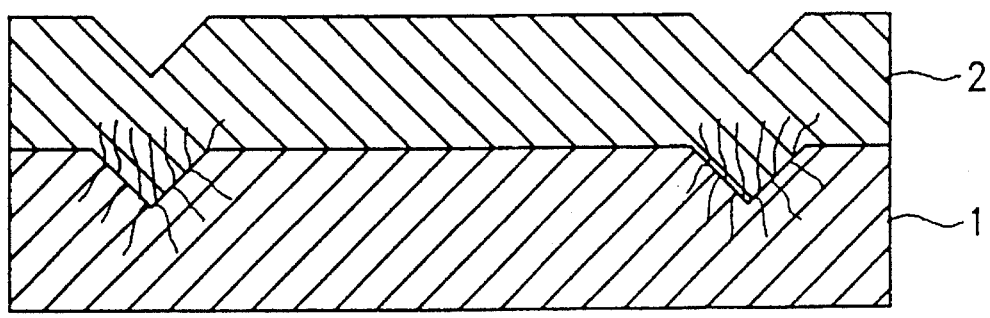
Figure 1E:
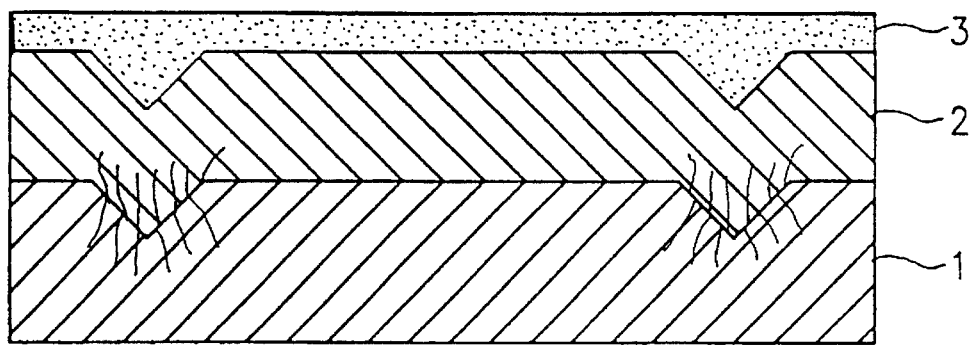

The misfits of the above two cases are formed and distributed not for themselves, but as shown in FIG. 1d, the most or the whole of the dislocations is concentrated in the V grooves owing to the existence of the V grooves.

Further, the dislocations are distributed on the monocrystalline film 1 and on the hereto film 2 simultaneously.

While the misfit dislocations are intensively concentrated near the V grooves owing to the removal or slackening of the stress effect, the rest of the hetero film 2 remains as a non-stress region or a non-dislocation region.

Figure 1F:
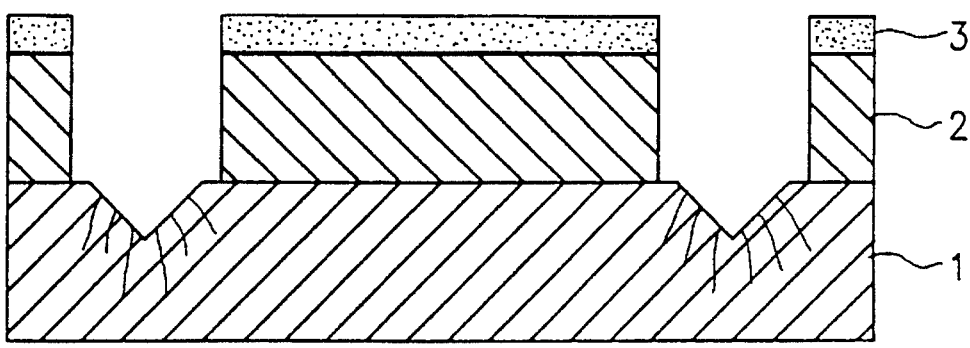

Then, an oxide layer 3 is deposited on the hetero film 2 (refer to FIG. 1e), and then, by applying a selective dry etching, the oxide layer 3 and the hetero film 2 of the V groove portions on which the dislocations are intensively concentrated are removed (refer to FIG. 1f).

After the removal of the V groove portions as described above, the residue oxide layer 3 is removed as shown in FIGg, so that the hereto film 2 would form a non-dislocation junction structure receiving no stress from the substrate.

Figure 1G:
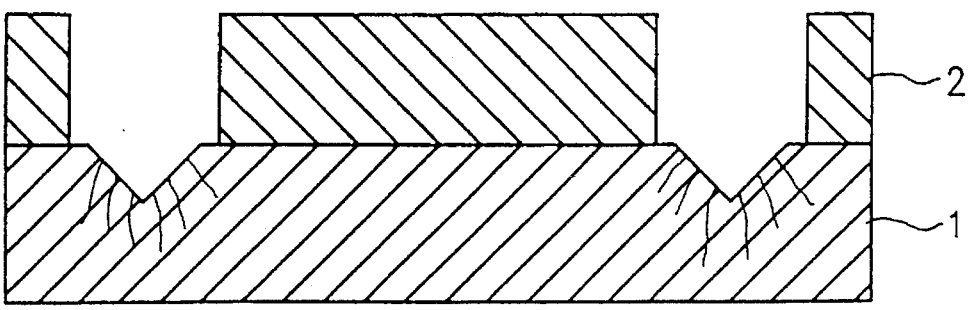

FIG. 1g shows a non-stress non-dislocation hetero junction structure which is completed through the above described steps. Various devices may be formed on this structure.

In the above described structure, dislocations are formed near the V grooves of the monocrystalline film 1 so as to remain.

FIG. 2 is a sectional view showing a second embodiment of the process for formation of the hereto junction structured film utilizing V grooves, and, in this embodiment, the dislocations are completely removed.

In this second embodiment of FIG. 2, the steps of FIGS. 1a to 1e are carried out in the same way.

Figure 2A:
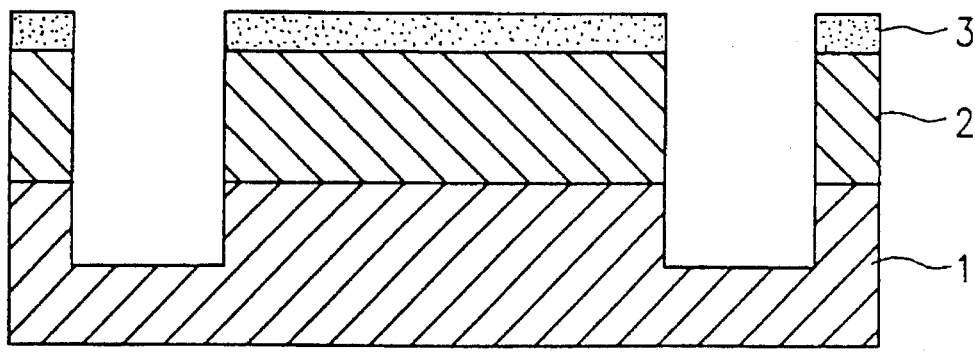
FIGS. 2a to 2c are sectional views showing a second embodiment of the process for formation of the hetero junction film utilizing V grooves according to the present invention.
Figure 2B:
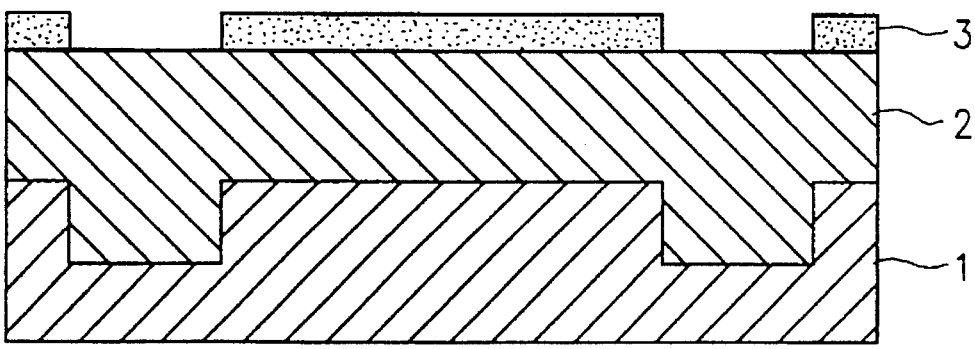

Thus when the oxide layer 3 is deposited upon the hereto film 2, there are removed by applying a non-selective etching method a part of the hereto film 2, the monocrystalline film 1 and the oxide layer 3 of the V grooves on which the dislocations are intensively concentrated (refer to FIG. 2a).

Then the hetero film 2 of FIG. 1c is selectively redeposited on the portions of the hetero film 2 and the monocrystalline film 1 from which the V grooves have been removed. Thus the portions of the V grooves are refilled with the monocrystalline hereto film 2 (refer to FIG. 2b).

Figure 2C:
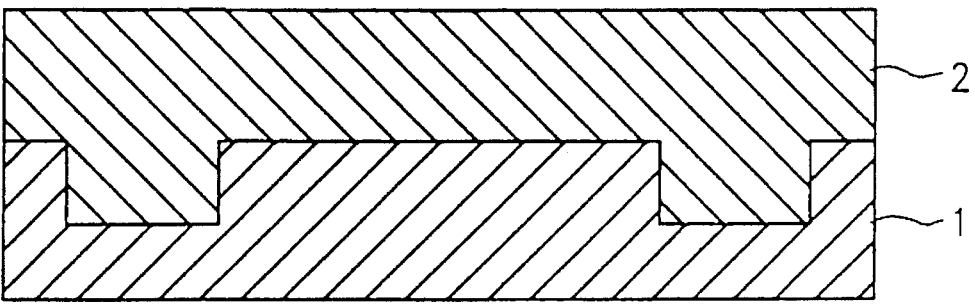

Thus after recharging the portions where the V grooves have been removed, the residue oxide layer 3 is removed as shown in FIG. 2c, so that there would be formed a hereto junction structure in which the dislocations are completely removed. Upon this structure, various devices can be formed.

FIG. 3 is a sectional view showing a third embodiment of the process for formation of the hetero junction structured film utilizing V grooves according to the present invention.

In this third embodiment, the steps of FIGS. 1a to 1e and the etching step of FIG. 2a are carried out in the same way.

In this embodiment, a part of the hetero film 2, the monocrystalline film 1 and the oxide layer 3 of the V groove portions on which the dislocations are intensively concentrated are removed. Then a material such as that of the monocrystalline film 1 is selectively deposited on the portions of the hetero film 2 and the monocrystalline film 1 on which the V grooves have been removed, thereby refilling the V groove portions in a monocrystalline form (refer to FIG. 3a).

Figure 3A:
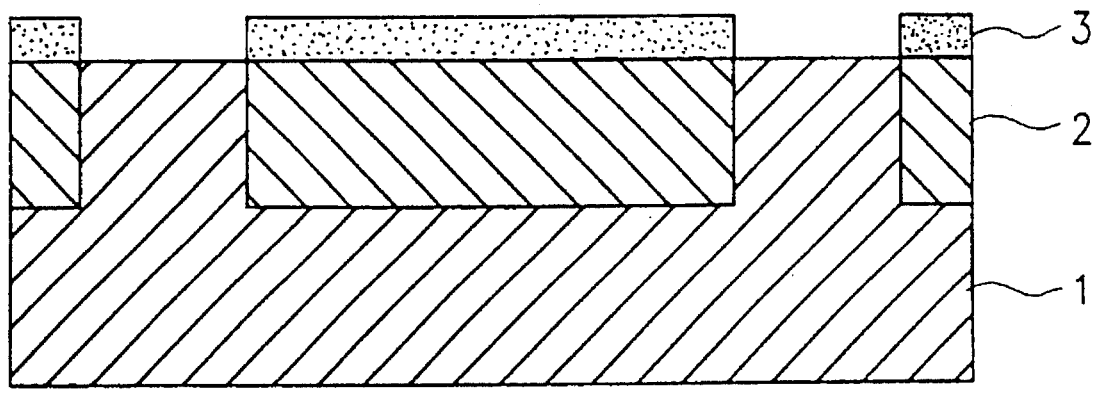
FIGS. 3a and 3b are sectional views showing a third embodiment of the process for formation of the hetero junction film utilizing V grooves according to the present invention.
Figure 3B:
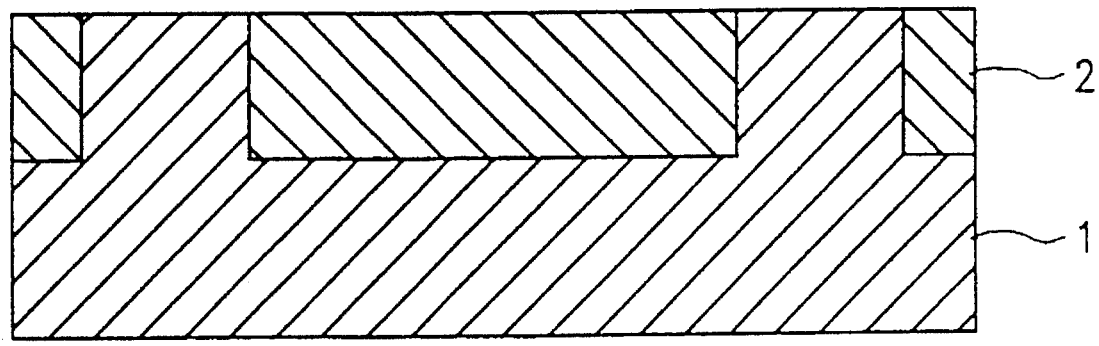

After thus recharging the portions where the V grooves have been removed, the residue oxide layer 3 is removed as shown in FIG. 3b, so that there would be formed a hetero junction structure in which the dislocations have been completely removed. Upon this structure, various devices can be formed.

Here, if the structure (FIG. 2a) in which the V groove portions have been removed through an etching is properly heat-treated just before the redeposition for refilling, then the quality of the monocrystalline film 1 which is refilled at the refilling step can be improved.

Meanwhile, the surface irregularities which occur after the redeposition at the steps of FIG. 2c and FIG. 3b can be made smooth through grinding.

If the hetero junction structures which are formed by the second and third embodiment of the present invention are subjected to a redeposition process, stress is slightly formed on the hetero junction boundary which is formed during the refilling along the face which have been formed during the etching at the step of FIG. 2a.

However, this level of stress is of the degree that corresponds to a region relevant to a thin film. If the fact that the thickness of the film is not more than several μm is taken into account, the existing stress is too small, with the result that it barely forms misfit dislocations.

Therefore, in the hetero junction structures of the second and third embodiment of the present invention, stress exists more or less unlike the first embodiment of the present invention, but they are thermally stable to such a degree that the misfit dislocations cannot be formed. Therefore, they can be maintained as low stress non-dislocation hetero junction structures.

Further, in FIG. 1b, even if a single film but a multilayer film is grown, the same effect can be obtained. Further, the steps of FIG. 1c to FIG. 2c or FIG. 3b may be repeatedly carried out, so that low stress and non-dislocation multilayer film structure may be grown.

FIG. 4 is a sectional view showing a fourth embodiment of the process for formation of the hetero junction structured film utilizing V grooves according to the present invention.

In this fourth embodiment, the steps of FIGS. 1a to 1g are carried out in the same way.

A thin oxide layer 3 is deposited (refer to FIG. 4a) on the structure of FIGS. 1a to 1g by applying a thermal oxidation method or a chemical depositing method.

Figure 4A:
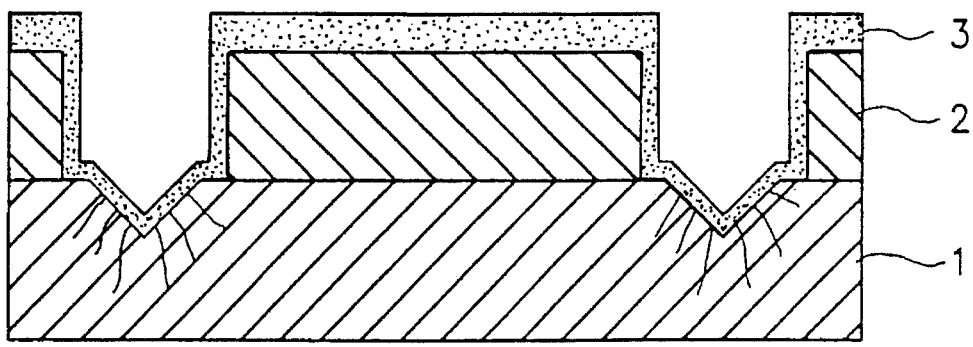
FIGS. 4a to 4c are sectional views showing a fourth embodiment of the process for formation of the hetero junction film utilizing V grooves according to the present invention.
Figure 4B:
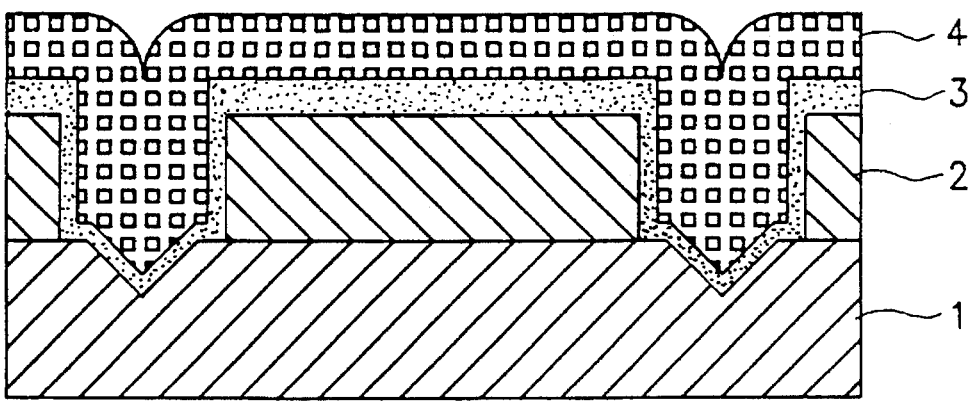
Figure 4C:
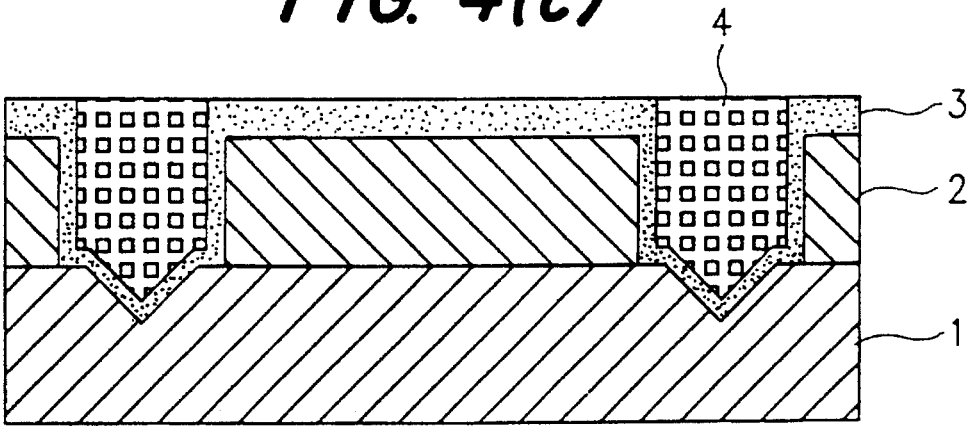

Then as shown in FIG. 4b, a polycrystalline silicon film 4 is deposited upon the oxide layer 3, and then, as shown in FIG. 4c, the surface is made smooth by applying a selective grinding method.

The structure which is formed based on the above described process is applied for forming various unit elements.

According to the present invention as described above, the distributions of the misfit dislocations are made to be concentrated around the V grooves, and then, these dislocation concentrated portions are removed, thereby making it possible to manufacture a non-stress non-dislocation hetero junction structured film.

Further, the removed portions are filled with a monocrystalline film or a hetero film to increase the critical thickness, so that the thickness of the film may be arbitrarily adjusted regardless of the critical thickness, and that the structural and electrical characteristics of the hetero junction film may be improved.

The present invention essentially eliminates the stress effects and the misfit dislocations which are the most serious impeding factors in utilizing the misfit hetero junction structure as a device. Therefore, the film of the present invention may contribute to the developments of optical devices and high speed devices using the hereto epitaxial structures of InAs/GaAs or SiGe/Si, or to the development of special devices utilizing the quantum effect.

Particularly, with the present invention, a light receiving device which is used in fiber optics communication can be developed by properly combining Ge and Si in which the misfits are 42%. Further, according to the present invention, the existing advanced silicon techniques and the fiber optics (which has been considered as an exclusive field of the chemical semiconductor) may be properly combined, so that advantages may be obtained in the speed and price of the semiconductor device.

Further, the process of the present invention may be used as an electrical isolating method for isolating unit elements by utilizing a polycrystalline silicon film.

What is claimed is:

1. A process for formation of a hetero junction structured film utilizing V grooves, comprising the first to third steps of:

forming a pattern having V grooves repeatedly formed with certain intervals on a monocrystalline film, and then, etching said pattern;

growing a hetero epitaxial film having said V grooves misfited with said etched monocrystalline film on said film, and then, depositing an oxide layer upon said hereto film; and carrying out a selective dry etching to remove the portions of said hereto film and said oxide layer on which dislocations are concentrated, and then, removing the residue oxide layer, whereby a non-stress non-dislocation hetero junction structure is formed.

2. The process as claimed in claim 1, wherein, instead of said monocrystalline film, a multi-layer film is used.

3. The process as claimed in claim 1, wherein said pattern is provided with repeated intervals by taking into account the degree of the misfits in relation with the film to be deposited upon said monocrystalline film, and said pattern consists of a cyclic line pattern or a mesh pattern having V cross-sectioned grooves in the longitudinal or lateral direction of said film on the whole surface or on a part of said film.

4. The process as claimed in claim 1, wherein, if the thickness of said hereto film is smaller than the critical thickness, the stress effect is artificially removed by carrying out a heat treatment, so that the most or the whole of the misfit dislocations would be intensively concentrated within said V grooves.

5. The process as claimed in claim 1, wherein, if the thickness of said hereto film is larger than the critical thickness, the stress effect is naturally slackened during the growth of said film, so that the most or the whole of the misfit dislocations would be intensively concentrated within said V grooves.

6. The process as claimed in claim 1, wherein, after carrying out the second step, fourth to fifth steps are carried out by:

removing a part of said monocrystalline film and said hetero film of the V groove portions on which the dislocations are intensively concentrated, by applying a non-selectiveetching; and filling the V groove portions with a monocrystalline film by selectively redepositing the hereto film material into portions where the V grooves are removed from said monocrystalline film and said hereto film, and then, removing the residue oxide layer, whereby a low stress and non-dislocation hereto junction structure is formed.

7. The process as claimed in claim 6, wherein the second step, the fourth step and the fifth step are repeatedly carried out, whereby a low stress and non-dislocation multi-layer film structure is formed.

8. The process as claimed in claim 6, wherein, after carrying out the fourth step, the V groove portions are filled with a monocrystalline film by selectively depositing the monocrystalline film material into the portions where the V grooves are removed from said monocrystalline film and said hereto film, and then, the residue oxide layer is removed, whereby a low stress non-dislocation hetero junction structure is formed.

9. The process as claimed in claim 8, wherein the second step, the fourth step and the sixth step are repeatedly carried out, whereby a low stress non-dislocation multi-layer structure is formed.

10. The process as claimed in any one of claims 6 and 8, wherein, after carrying out the fourth step, and after carrying out a step of heat-treating the V groove-removed structure to improve the quality of the filled film, the fifth and sixth steps are carried out.

11. The process as claimed in any one of claims 6 and 8, wherein after carrying out the fifth or sixth step, the surface irregularities formed after the redeposition are smoothened by applying a grinding process.

12. The process as claimed in claim 1, wherein, after carrying out the third Step, seventh and eighth steps are carried out by:

depositing an oxide layer on the hetero junction structure by applying a thermal oxidation method or a chemical depositing method; and depositing a polycrystalline silicon film on said oxide layer, and then, smoothening the surface irregularities by applying a selective grinding.

* * * * *